United States Patent
Higashidate

(10) Patent No.: US 9,437,461 B2
(45) Date of Patent: Sep. 6, 2016

(54) SEMICONDUCTOR DEVICE AND METHOD FOR MANUFACTURING THE SAME

(71) Applicant: FUJI ELECTRIC CO., LTD., Kawasaki-shi (JP)

(72) Inventor: Makoto Higashidate, Hino (JP)

(73) Assignee: FUJI ELECTRIC CO., LTD., Kawasaki-shi (JP)

( * ) Notice: Subject to any disclaimer, the term of this patent is extended or adjusted under 35 U.S.C. 154(b) by 0 days.

(21) Appl. No.: 14/730,651

(22) Filed: Jun. 4, 2015

(65) Prior Publication Data

US 2016/0035643 A1 Feb. 4, 2016

(30) Foreign Application Priority Data

Jul. 31, 2014 (JP) ................................. 2014-156177

(51) Int. Cl.
| | |
|---|---|
| *H01L 23/10* | (2006.01) |
| *H01L 21/48* | (2006.01) |
| *H01L 23/373* | (2006.01) |
| *H01L 23/36* | (2006.01) |
| *H01L 23/00* | (2006.01) |
| *H01L 25/07* | (2006.01) |

(52) U.S. Cl.
CPC ........... *H01L 21/4871* (2013.01); *H01L 23/36* (2013.01); *H01L 23/3735* (2013.01); *H01L 23/3736* (2013.01); *H01L 24/29* (2013.01); *H01L 25/072* (2013.01); *H01L 2224/291* (2013.01); *H01L 2924/13055* (2013.01); *H01L 2924/13091* (2013.01)

(58) Field of Classification Search
CPC . H01L 23/36; H01L 23/367; H01L 23/3672; H01L 23/3736; H01L 23/42; H01L 21/4871
USPC .......................................... 257/704, 706, 713
See application file for complete search history.

(56) References Cited

U.S. PATENT DOCUMENTS

| | | | | |
|---|---|---|---|---|
| 6,317,218 | B1* | 11/2001 | Yorkey | G06K 15/16 347/115 |
| 7,224,047 | B2* | 5/2007 | Carberry | H01L 23/4334 257/433 |
| 2003/0057573 | A1* | 3/2003 | Sekine | H01L 23/3107 257/787 |
| 2005/0093131 | A1* | 5/2005 | Nakase | H01L 23/42 257/693 |
| 2007/0001273 | A1* | 1/2007 | Sato | H01L 23/485 257/666 |
| 2007/0052070 | A1* | 3/2007 | Islam | H01L 21/561 257/666 |
| 2010/0096747 | A1* | 4/2010 | Kusano | H01L 21/565 257/706 |

(Continued)

FOREIGN PATENT DOCUMENTS

| | | |
|---|---|---|
| JP | 2500669 B2 | 5/1996 |
| JP | 2008159857 A | 7/2008 |

*Primary Examiner* — Nitin Parekh
(74) *Attorney, Agent, or Firm* — Rossi, Kimms & McDowell LLP

(57) ABSTRACT

Aspects of the invention include a semiconductor device that enables both solder-outflow prevention and inhibition of seizures coming from laser processing residues. A semiconductor device can include a semiconductor chip, a plurality of insulating substrates on each of which the semiconductor chip is fixed, a heat sink having a plurality of first grooves surrounding each one of more than one predetermined arrangement area. The plurality of insulating substrates can be arranged at each of the predetermined areas, and a plurality of second grooves surrounding the first groove, wherein the second grooves are shallower in depth than each of the first grooves, and solder filled between the insulating substrate and the arrangement area on the heat sink.

8 Claims, 9 Drawing Sheets

(56) References Cited

U.S. PATENT DOCUMENTS

2010/0167436 A1* 7/2010 Lin .................. H01L 21/486
 438/26
2010/0224985 A1* 9/2010 Michael ............. H01L 23/3114
 257/692
2014/0264815 A1* 9/2014 Yew .................. H01L 23/04
 257/704

* cited by examiner

SEMICONDUCTOR DEVICE AND METHOD FOR MANUFACTURING THE SAME

CROSS-REFERENCE TO RELATED APPLICATION

This application is based on, and claims priority to, Japanese Patent Application No. 2014-156177, filed on Jul. 31, 2014. The disclosure of the priority application, in its entirety, including the drawings, claims, and the specification thereof, is incorporated herein by reference.

BACKGROUND OF THE INVENTION

1. Field of the Invention

The present invention relates to a semiconductor device and to a method for manufacturing the same. In particular, the present invention relates to a groove, which is disposed on a heat sink, for preventing solder from flowing out.

2. Description of the Related Art

FIGS. 9A and 9B show a schematic view of a conventional semiconductor device 500. FIG. 9A is a plan view thereof. FIG. 9B is a magnified sectional view cut along the line X-X in the FIG. 9A. FIGS. 9A and 9B illustrate a heat sink 51 on which a groove 55 is disposed and an insulating substrate 52 fixed to the heat sink 51 with solder 53. An insulating plate such as ceramic, a back surface copper foil stuck on the back surface thereof, and front surface copper foils forming a circuit pattern stuck on the front surface thereof constitute the insulating substrate 52. A semiconductor chip not shown is fixed to the front surface copper foil. The back surface of the insulating substrate 52 is fixed to the heat sink 51 with the solder 53.

In FIGS. 9A and 9B, each one of a plurality of (two in this case) insulating substrates 52 is fixed at each one of predetermined arrangement areas on the heat sink 51. A mother material 50 composed of aluminum or the like and a nickel layer 54 coating the surface thereof to ensure solder wettability and to avoid oxidation constitute the heat sink 51. The nickel layer 54 is composed of a nickel plating layer or the like.

On the assembly process of the semiconductor device 500, if the plurality of insulating substrates 52 are fixed to the heat sink 51 with solder 53, there may be such a case that adjacent pieces of molten solder are in contact with each other to run on to the front surface of the insulating substrate 52. Then insulation failure will occur at the spot where the solder has run on. To avoid such circumstances, it is carried out that one groove 55 is disposed around the area where the insulating substrate 52 will be arranged on the surface of the heat sink 51, preventing molten solder from flowing out as described in Japanese Patent No. 2500669, and Japanese Unexamined Patent Application Publication No. 2008-159857.

Mounting the plurality of insulating substrates 52 on one sheet of the heat sink 51 may require that the width of the groove 55, which becomes a dead space, decreases as narrow as possible, and then the insulating substrate 52 mounted on the heat sink 51 increases in number. On the other hand, if the width of the groove 55 decreases excessively, solder can flow out from the groove 55. Then the problem that the adjacent pieces of molten solder are in contact with each other may occur as described earlier.

SUMMARY OF THE INVENTION

Embodiments of the invention address the problems described above, and other problems, and to provide a semiconductor device having groove shape that enables both solder-outflow prevention and dead space reduction.

According to one aspect of the present invention, there is provided a semiconductor device comprising: a semiconductor chip; a plurality of insulating substrates on each of which the semiconductor chip is fixed; a heat sink having a plurality of first grooves surrounding each one of more than one predetermined arrangement area, wherein each of the plurality of insulating substrates is arranged at each of the predetermined areas, and a plurality of second grooves surrounding the first grooves, wherein the second grooves are shallower in depth than each of the first grooves; and solder filled between the insulating substrate and the arrangement area on the heat sink.

Further, according to another aspect of the present invention, there is provided a method for manufacturing a semiconductor device comprising the steps of: preparing a heat sink and a plurality of insulating substrates; forming a plurality of first grooves surrounding each one of predetermined arrangement areas where each of the plurality of insulating substrates is arranged and a plurality of second grooves surrounding the first grooves on the heat sink by using laser processing, wherein the second grooves are shallower in depth than each of the first grooves; arranging a solder plate and the insulating substrate in a stacked fashion at each of the arrangement areas; heating the solder plate to melt; and cooling the molten solder to solidify.

Embodiments of the invention can provide a semiconductor device having optimum groove shape enabling both solder-outflow prevention and dead space reduction.

DETAILED DESCRIPTION

Figure 1A:
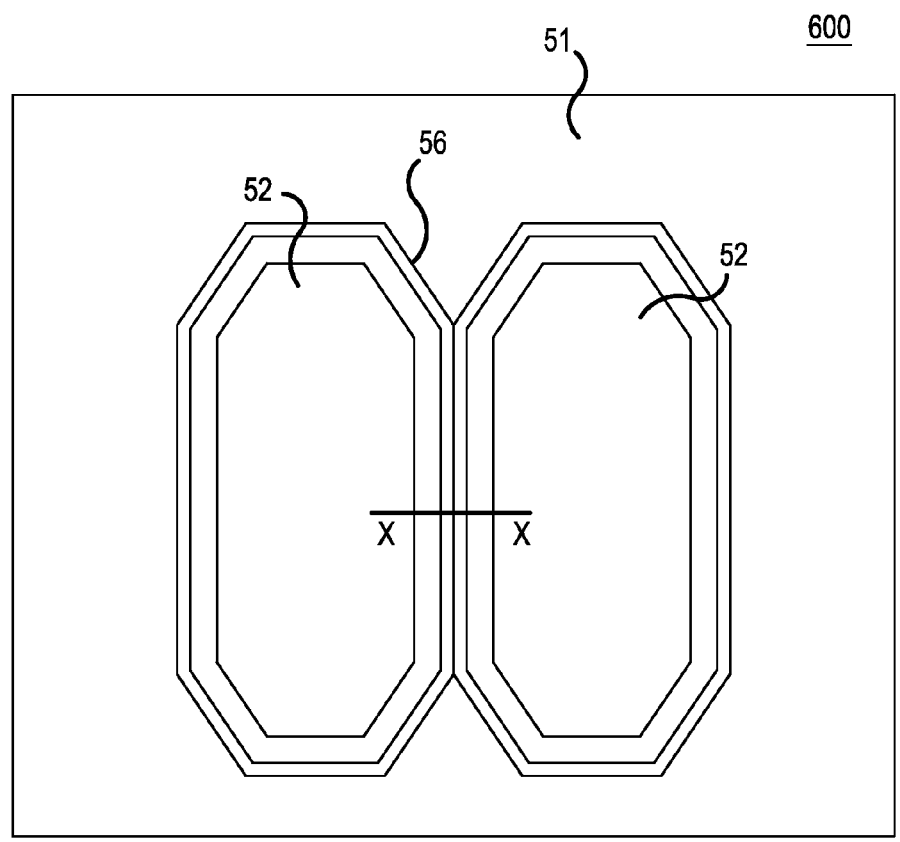
FIGS. 1A and 1B are schematic views of a semiconductor device 600 according to a reference.
Figure 1B:
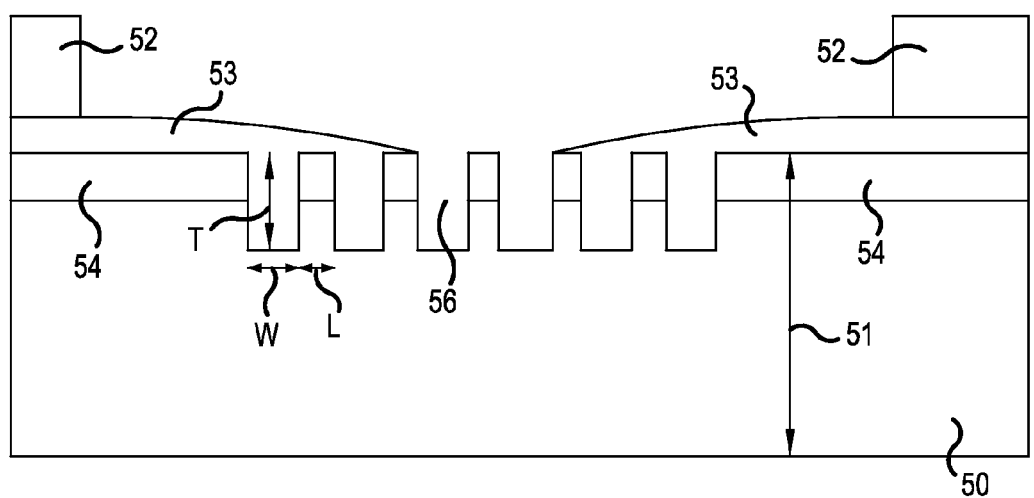

Embodiments will be described as follows. FIGS. 1A and 1B are schematic views of a semiconductor device 600 according to the reference. FIG. 1A is a simplified plan view thereof. FIG. 1B is a magnified sectional view cut along the line X-X of FIG. 1A. As shown in FIG. 1B, in the semiconductor device 600, a plurality of (three in this case) grooves 56 (not shown in detail in the simplified plan view of FIG. 1A) is laid out in a stripe pattern at around the insulating substrate 52. In comparison with the case having one groove, arranging the plurality of grooves 56 can prevent solder-outflow effectively even though those narrow widths because the resistance against solder-outflow increases on the surface of the heat sink 51. As described above, it is possible to employ laser processing in the method for forming the plurality of grooves 56 having narrow widths in a stripe pattern.

Figure 2:
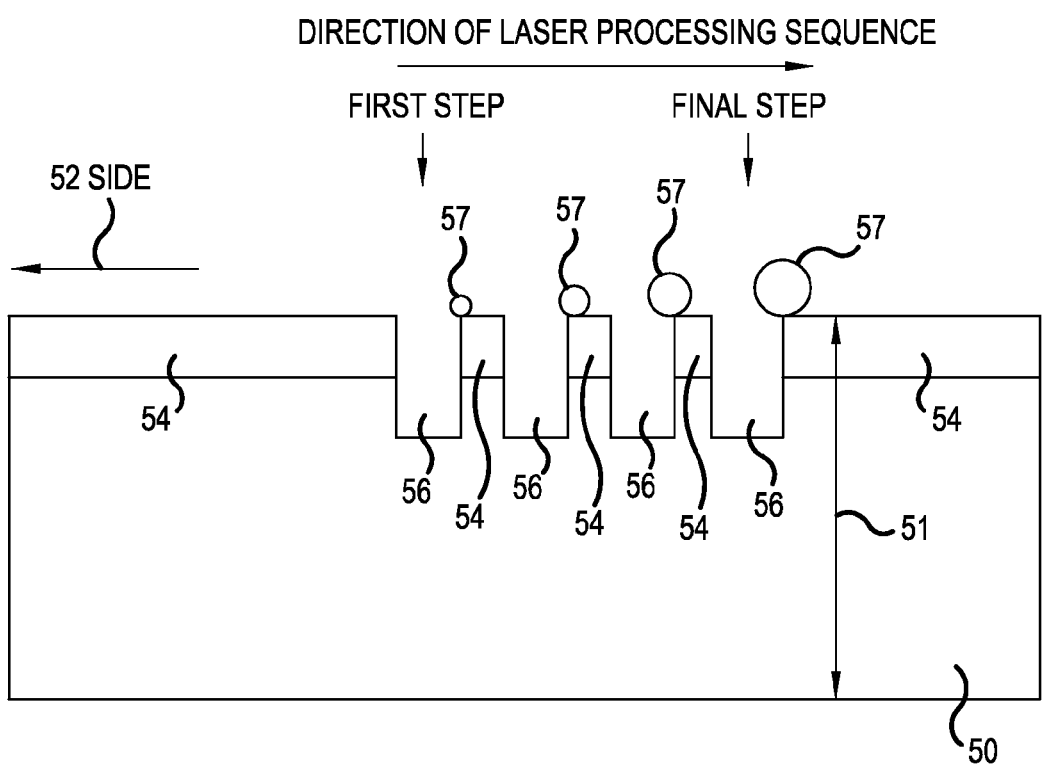
FIG. 2 illustrates an appearance that a processing residue 57 is formed.

When the groove 56 described above is formed by laser processing, however, a seizure 58 coming from processing residues 57 produced by laser processing may occur as shown in FIGS. 2 and 3. The seizure 58 indicates the thing that the processing residues 57, which are produced to be in molten state at the time when the groove 56 is formed, have stuck and solidified on the groove 56.

Furthermore, the formation of the groove 56 employed as solder-outflow prevention may require that a width W of the groove 56, which becomes a dead space, and an interval L between grooves (barrier thickness) get to become narrow.

Also, when the groove 56 is formed by laser processing, the seizure 58 described above tends to occur easily in the case that a depth T of the groove 56 becomes deep.

FIG. 2 illustrates an appearance that the processing residue 57 is formed. Laser processing sequence for forming the groove 56 begins the first step formation thereof at the insulating substrate 52 side, progressing toward outside in the direction of the arrow. Then this completes the final step formation thereof. As shown in FIG. 2, the processing residues 57 accumulate as laser processing sequence becomes later, becoming larger gradually. The processing residues 57 produced by laser processing can be absorbed and removed by dust collector accompanied in a laser processing machine.

Figure 3A:
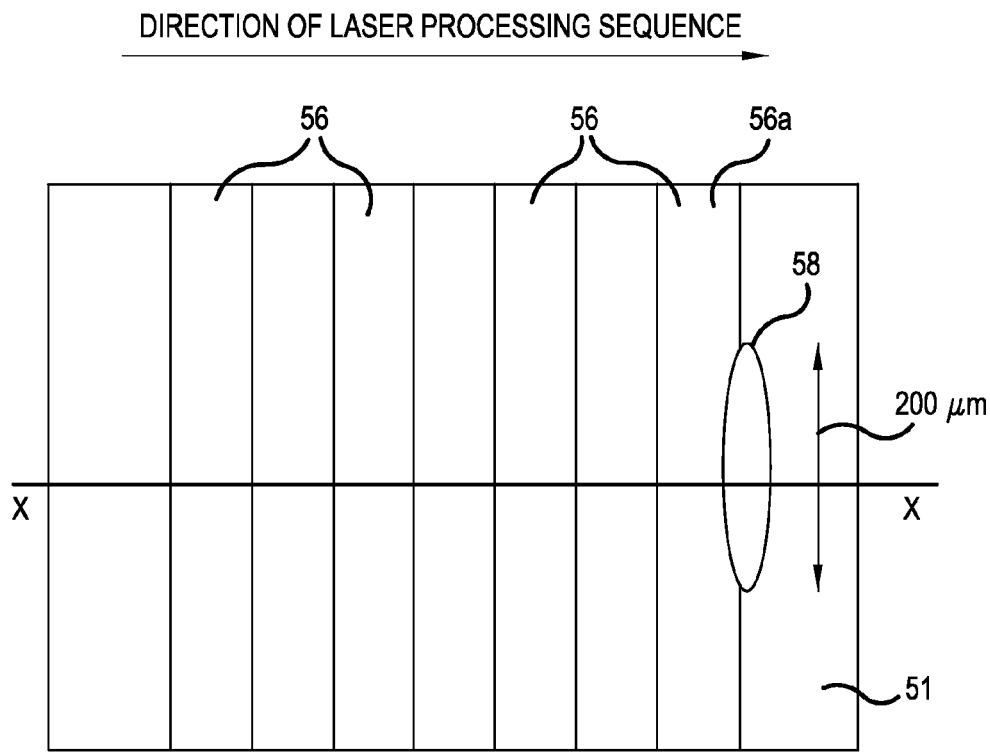
FIGS. 3A and 3B illustrate an appearance that a seizure 58 coming from the processing residue 57 has occurred at a groove 56.
Figure 3B:
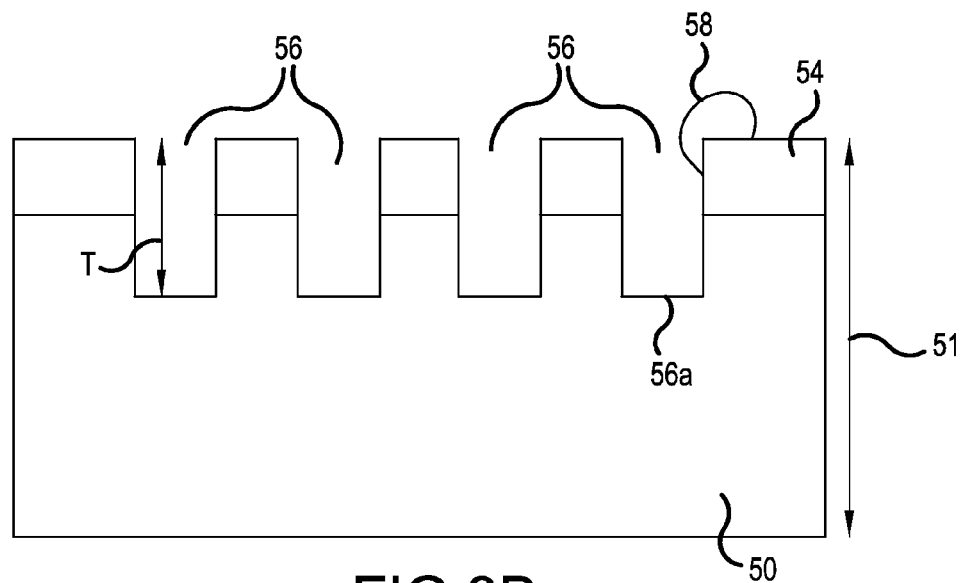

FIGS. 3A and 3B illustrate an appearance that the seizure 58 has occurred at a groove 56. FIG. 3A is a plan view of the heat sink 51 on which the seizure 58 has occurred. FIG. 3B is a sectional view cut along the line X-X in FIG. 3A. As shown in FIGS. 3A and 3B, a big piece of the seizure 58 has occurred at a groove 56a formed during the final step of laser processing.

Figure 4:
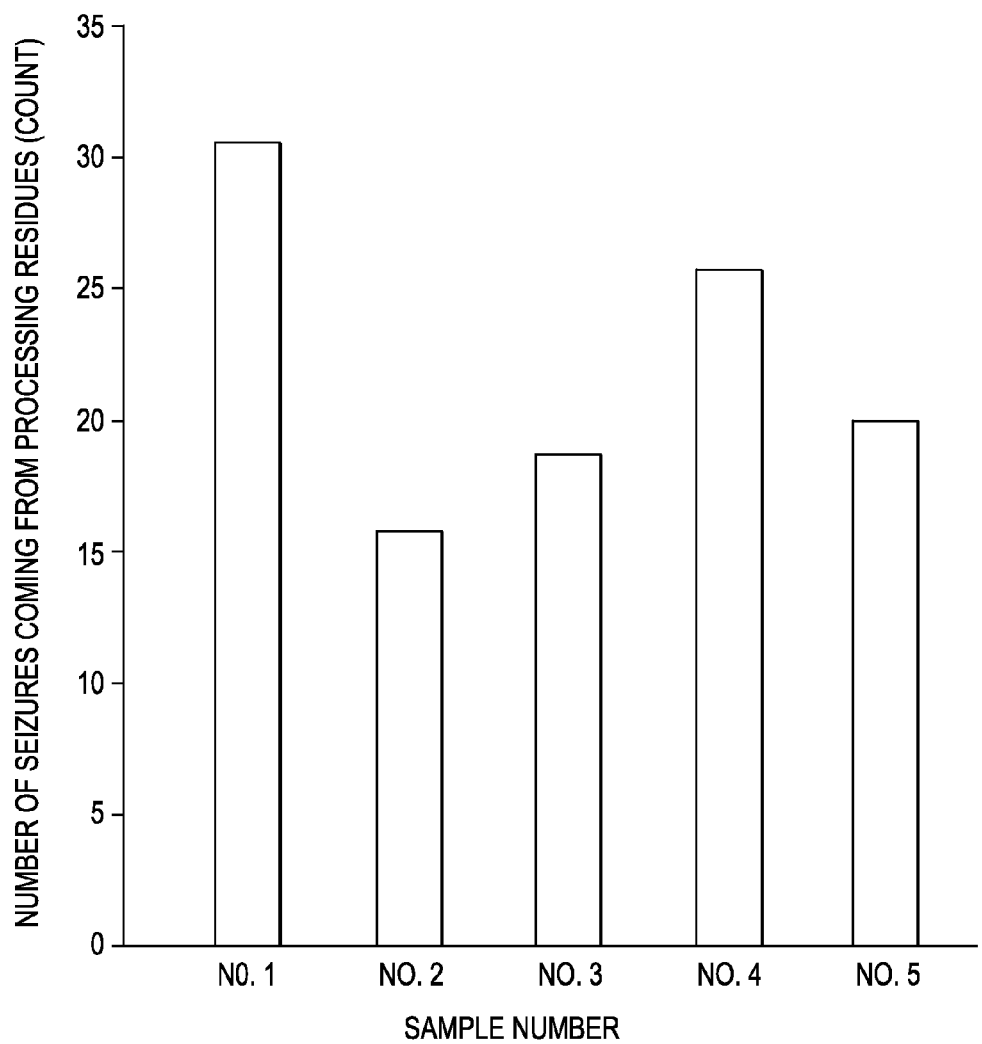
FIG. 4 shows the number of the seizures 58 coming from the processing residues 57.

FIG. 4 shows the number of the seizures 58 coming from the processing residues 57. The vertical axis shows the number of the seizures 58, and the horizontal axis indicates a sample number. There are five samples. The seizure 58 has occurred on the groove 56a, which is formed during the final step of laser processing described in the reference, among the grooves 56 employed to prevent the solder-outflow. As shown in FIG. 4, the number is scattered in the range of around 15 to 30 over the whole area of the circular groove 56a. There is an increasing tendency for the number of the seizures 58 when the depth T of the groove 56 deepens.

If there are a lot of seizures 58, it may be necessary to remove them because they cause poor-appearance and characteristic failure when they peel off and then stick on a semiconductor chip or an interconnection in post-processes (such as wire-bonding, gel-filling, and covering with resin case). However, the dust collector accompanied in the laser processing machine has only small suction force, and then there may be a case that the seizure 58 cannot be removed. In the case, the seizure 58 should be removed mechanically by getting in touch with special removing jig. Therefore, the poor work efficiency causes manufacturing cost to rise.

First Embodiment

Figure 5:
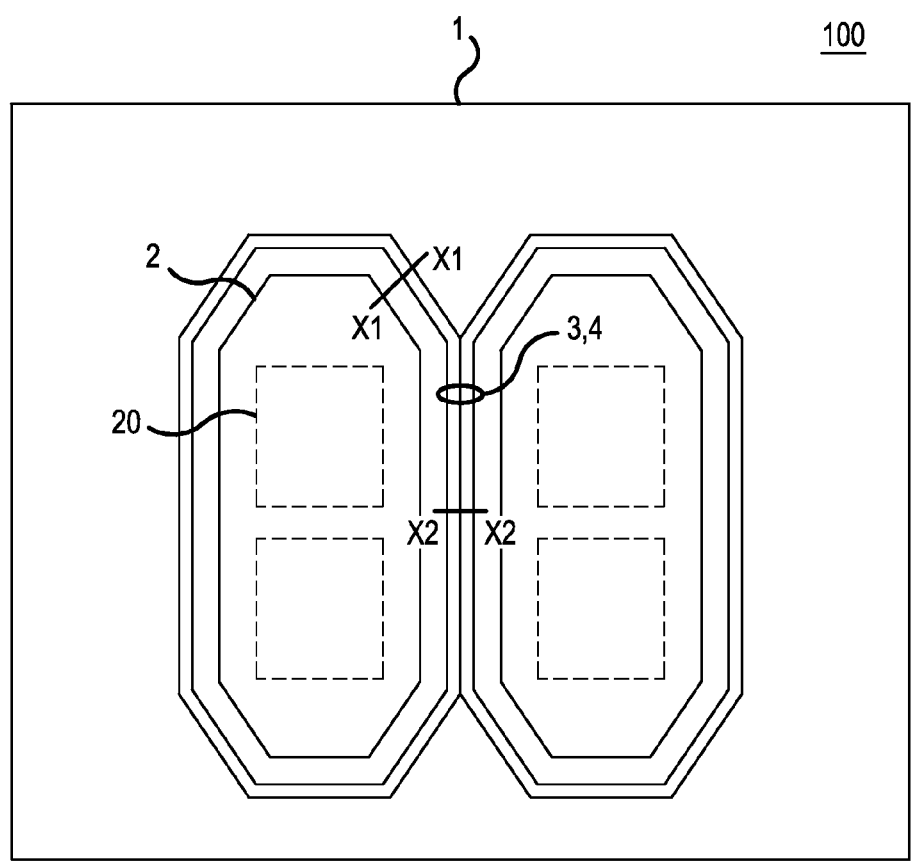
FIG. 5 is a plan view of a semiconductor device 100 according to a first embodiment of the present invention.
Figure 6A:
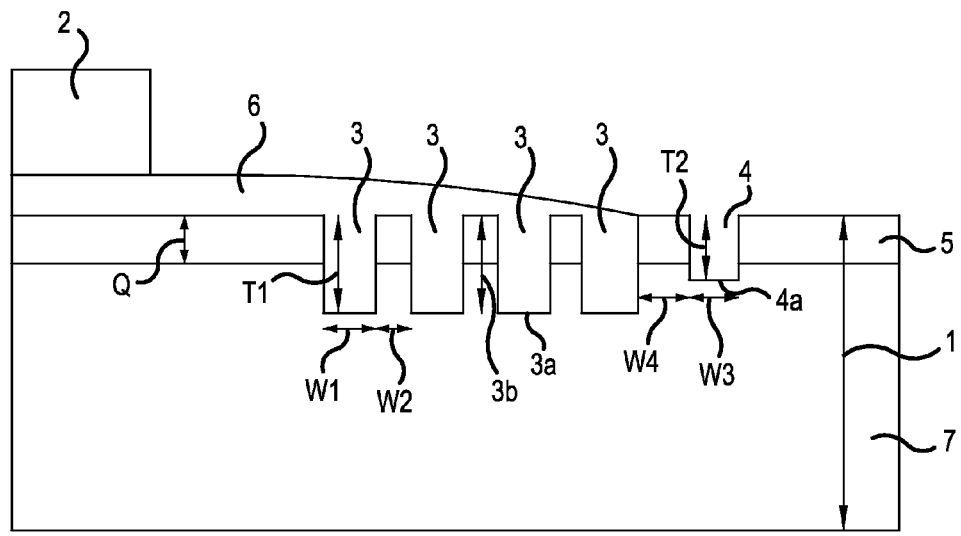
FIGS. 6A and 6B are magnified sectional views cut along the line X1-X1 in FIG. 5.
Figure 6B:
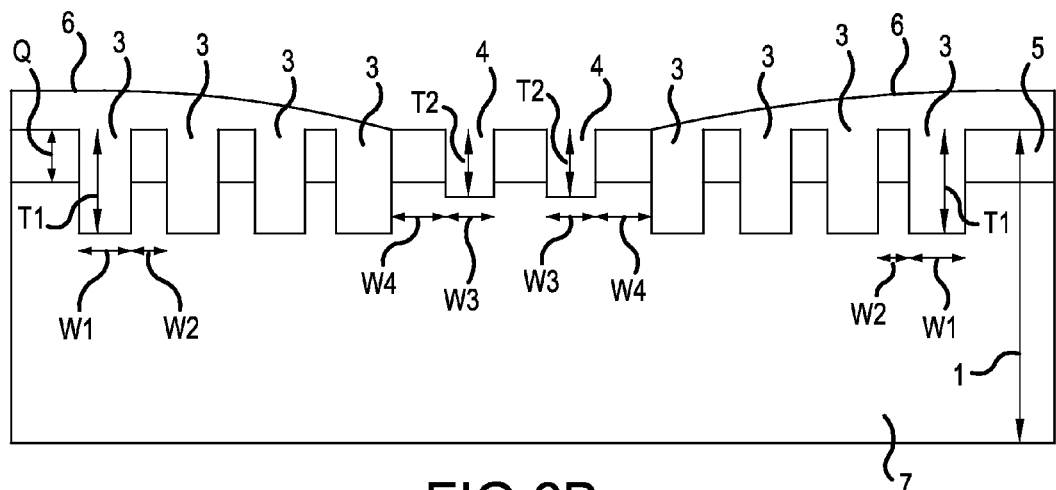

FIGS. 5, 6A and 6B are schematic views of a semiconductor device 100 according to the first embodiment of the present invention. FIG. 5 is a plan view thereof. FIG. 6A is a magnified sectional view cut along the line X1-X1 in FIG. 5. FIG. 6B is a magnified sectional view cut along the line X2-X2 in FIG. 5. The semiconductor device 100 comprises a semiconductor chip 20, an insulating substrate 2, a heat sink 1, and solder 6.

Vertical-type power semiconductor elements such as an insulated gate bipolar transistor (IGBT), a power MOSFET, and a free-wheeling diode (FWD) can be applied to the semiconductor chip 20.

A circuit plate, an insulating plate, and a metal plate (not shown for all), which are laminated one another, constitute the insulating substrate 2. Ceramic such as aluminum nitride and aluminum oxide is employed for the insulating plate. The circuit plate and the metal plate are composed of metal such as copper. Then, for example, direct copper bonding (DCB) can form the insulating substrate 2. Circuit plates 22 having a circuit pattern are formed in a selective manner on the front surface of the insulating plate. The semiconductor chip 20 is fixed by using solder or the like on the circuit plate 22 at the principal electrode side (such as a collector electrode and a cathode electrode).

The heat sink 1 comprises a first metal 7 and a second metal layer 5 coating the surface of the first metal 7. The first metal 7 is a high thermal-conductivity metal such as aluminum or copper and has a function for diffusing heat generated from the semiconductor chip 20 to the outside.

The second metal layer 5 is a plating layer composed of nickel, for example, and has functions for ensuring solder wettability to the heat sink 1 and for preventing the heat sink 1 from being oxidized. Furthermore, titanium may be used instead of nickel for the second metal layer.

More than one (two in the figure) insulating substrate 2 is arranged in predetermined arrangement areas on the heat sink 1. Then first grooves 3, which can prevent solder-outflow, are disposed so as to surround each of the arrangement areas in which each of the insulating substrates 2 is arranged. In addition, a plurality of second grooves 4, which are shallower in depth than each of the first grooves 3, is disposed so as to surround these first grooves 3. In comparison with the case having one groove, arranging a plurality of first grooves 3 and second groove 4 allows resistance against the solder-outflow to increase on the surface of the heat sink 1. Then this can prevent solder-outflow effectively even though the width thereof is narrow. In addition, the second groove 4 is shallower in depth than each of the first grooves 3. Then this can inhibit seizures coming from laser processing residues. Here, it shows that an instance has four first grooves 3 in a stripe pattern and one second groove 4. The present invention is not limited to the above description.

Laser processing allows the second metal layer 5 to be penetrated through and permits the first grooves 3 and the second groove 4 to be formed. The first metal 7 is exposed at the bottom surfaces 3a and 4a of the first groove 3 and the second groove 4, respectively. It is more preferable that the exposure of the first metal 7, which has less solder wettability than the second metal layer 5, can prevent molten solder from flowing out further.

The depth T1 of the first groove 3 is preferably formed to be equal to or more than the thickness Q (for example, 15 µm) of the second metal layer 5 and equal to or less than 50 µm. The reason is that the laser processing residue becomes large, and then the seizure thereof may occur if the depth T1 of the first groove 3 is more than 50 µm.

The depth T2 of the second groove 4 is preferably formed to be equal to or more than the thickness Q of the second metal layer 5 and equal to or less than three-quarters of the depth T1 of the first groove 3. If the depth T2 of the second groove 4 is formed to be equal to or more than the thickness Q of the second metal layer 5, the bottom surface 4a where the first metal 7 exposes appears at the second groove 4. Then spreading the molten solder to the second groove 4 can prevent the solder from flowing out effectively. On the other hand, if the depth T2 is formed to be more than three-quarters of the depth T1, it is not preferable because the effect becomes smaller for inhibiting the seizures coming from the processing residues.

Here, the sum of sectional-areas S of the first grooves 3 is defined as the depth T1 of the first groove 3 times the width W1 thereof times the number n thereof. Then optimum sectional shape according to the present invention will be described. Here, situations of solder flowing out are investigated when each laser processing is conducted to form one first groove 3 so that each sectional-area S is adjusted to 1600 µm$^2$, 2000 µm$^2$, 5000 µm$^2$, 7200 µm$^2$, and 8200 µm$^2$. As a result, when the sectional-area S of the first groove 3 is equal to or more than 7200 µm$^2$, the solder-outflow can be prevented certainly. In the case of forming the n first grooves 3 each of which has the same sectional-area, it is more preferable that when the symbol s0 denotes one groove sectional-area, the sum of sectional-areas S(=s0×n) of the first grooves 3 is equal to or more than 7200 µm$^2$. Furthermore, in the case of forming the n first grooves 3 each of which has different sectional-area denoted as S1, S2, . . . , Sn, it is preferable that $\Sigma S_n \geq 7200$ µm$^2$.

On the other hand, the dead space will increase when the width W1 of the first groove 3 gets to be wider to increase the sum of sectional-areas S of the first groove 3. Also, the number of seizures coming from the laser processing residues may increase when the depth T1 of the first groove 3 gets to be deeper to increase the sum of sectional-areas S. Then the sum of sectional-areas S is preferably equal to or less than 20000 µm$^2$. Further the number of the first grooves 3 is preferably around from one to fifty. If the number of the first grooves 3 is equal to or more than fifty, it is not preferable because the dead space becomes too large. In addition, more preferably, the number of the first grooves 3 is around from five to thirty.

Furthermore, it is preferable that the width W1 of the first groove 3 is equal to or more than 10 µm and equal to or less than 150 µm. It is not preferable on each of the cases that the molten solder can easily climb over the first groove 3 to spread out when the width W1 is less than 10 µm, and the dead space becomes too large when it is more than 150 µm.

Also, it is preferable that an interval W2 between adjacent first grooves 3 is equal to or more than 5 µm and equal to or less than 20 µm. If the interval W2 is less than 5 µm, maintaining accuracy may become difficult for processing a protruding portion 3b between the first grooves 3. If the interval W2 is more than 20 µm, the dead space may become too large. Then it is not preferable on each of the above cases.

It is preferable that the width W3 of the second groove 4 is nearly equal to the width W1 of the first groove 3. It is difficult to inhibit the seizures coming from the processing residues when the width W3 of the second groove 4 is less than 50 µm. The dead space becomes too large when the width W3 of the second groove 4 is more than 150 µm.

It is preferable that an interval W4 between the first groove 3 and the second groove 4 is formed to be equal to or more than 0 µm and equal to or less than 40 µm. The reason is as follows. When the interval W4 is more than 40 µm, becoming large excessively between the first groove 3 and the second groove 4, this causes an effect inhibiting the seizures, which is inherent to the second groove 4, to decrease.

On the other hand, even though the interval W4 is 0 µm; that is to say, the first groove 3 and the second groove 4 are in contact with each other, the seizure coming from the processing residues can be melted and removed. Then the interval W4 may be 0 µm.

According to the following embodiment, for example, the first groove 3 can prevent certainly the solder 6 from flowing out. The sum of sectional-areas S comes to 7200 µm$^2$ by setting the width W1 of the first groove 3 having a stripe pattern to be 6 µm, the depth T1 thereof to be 40 µm, the interval W2 between the adjacent first grooves to be 4 µm, and the number thereof to be thirty, respectively. The second grooves 4 having a stripe pattern are formed by setting the width W3 thereof to be 12 µm, the depth T2 thereof to be 30 µm, the interval W4 between the first groove 3 and the second groove 4 to be 40 µm, the interval between the adjacent second grooves 4 to be 8 µm, and the number thereof to be thirteen, respectively. Moreover, the thickness Q of the second metal layer and the sum of widths of the first grooves 3 are set to be 15 µm and 300 µm, respectively. The seizure can be inhibited, provided that the number of the second grooves 4 is equal to or more than one.

Figure 7:
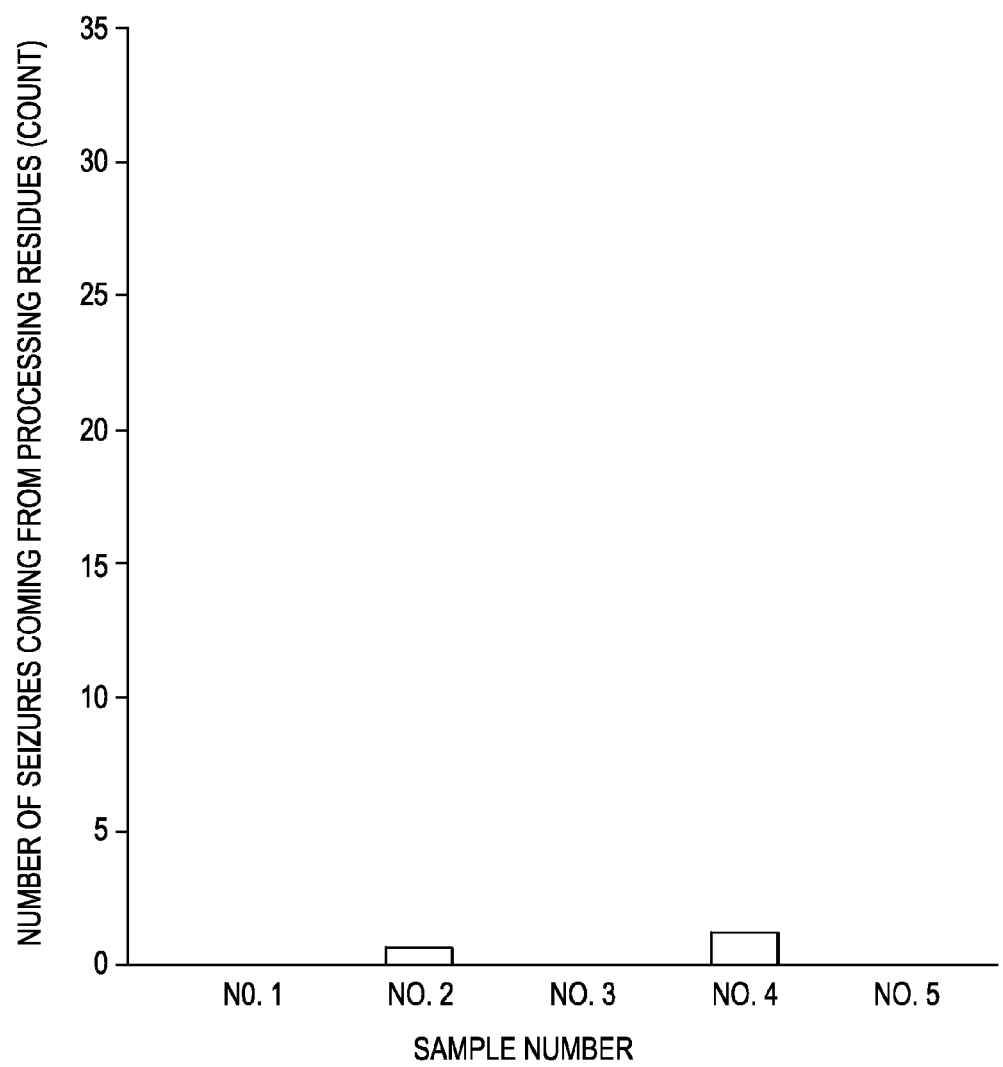
FIG. 7 shows the number of seizures coming from processing residues.

FIG. 7 shows the number of the seizures coming from the processing residues according to this embodiment. The vertical axis shows the number of the seizures, and the horizontal axis indicates a sample number. Based on a result, the present embodiment reveals that the number of the seizures is controlled to equal to or less than two in all samples. In addition, when the number of the seizures is equal to or less than five, there is no problem on characteristics.

This result reveals that the solder-outflow prevention is compatible with the inhibition of the seizures coming from the laser processing residues in the present embodiment.

Second Embodiment

Figure 8:
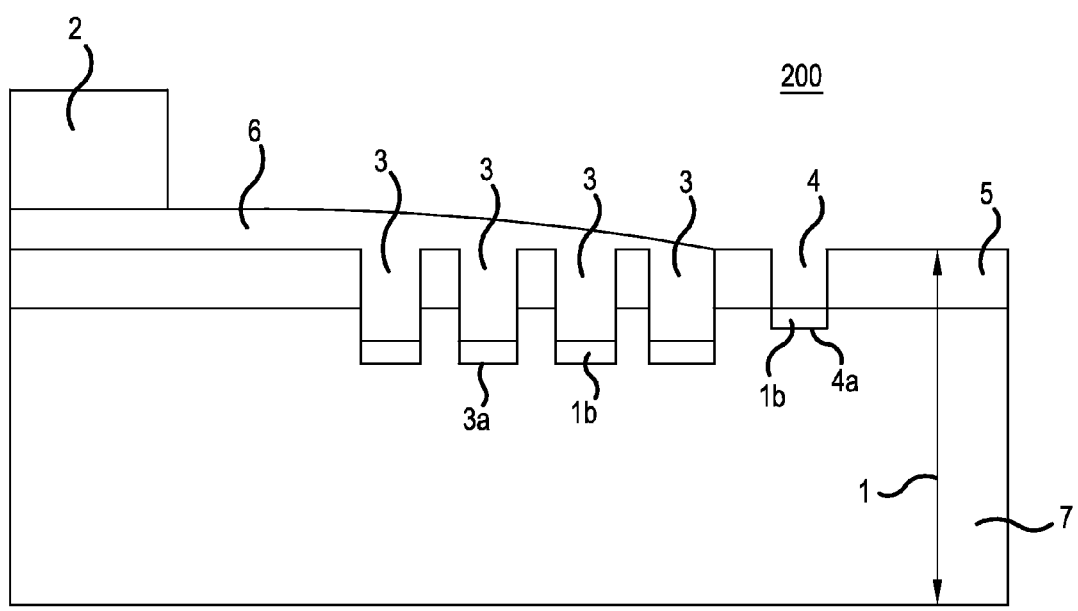
FIG. 8 is a sectional view of the essential part of a semiconductor device 200 according to a second embodiment of the present invention.
Figure 9A:
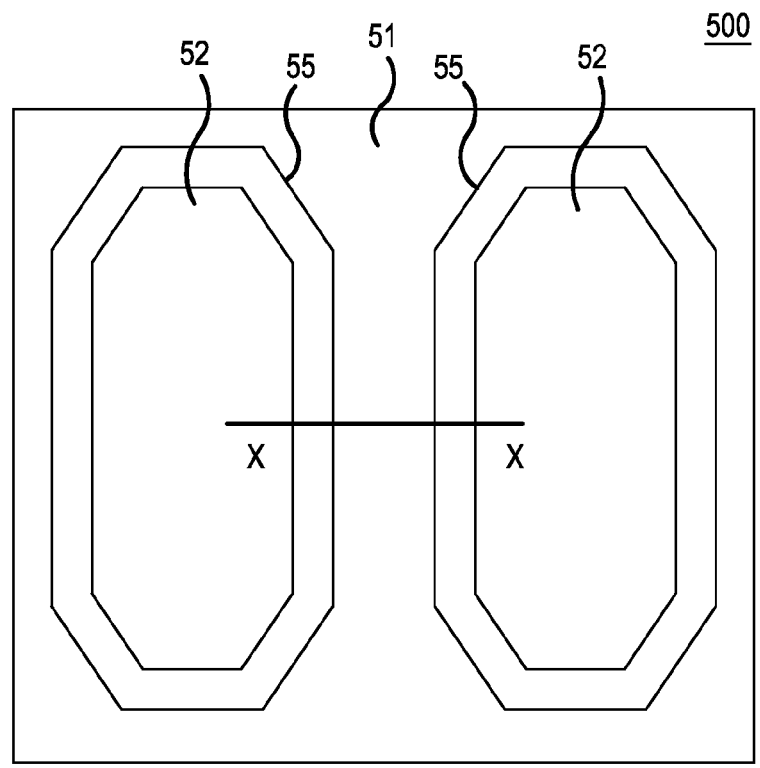
FIGS. 9A and 9B are a schematic view of a conventional semiconductor device 500.
Figure 9B:
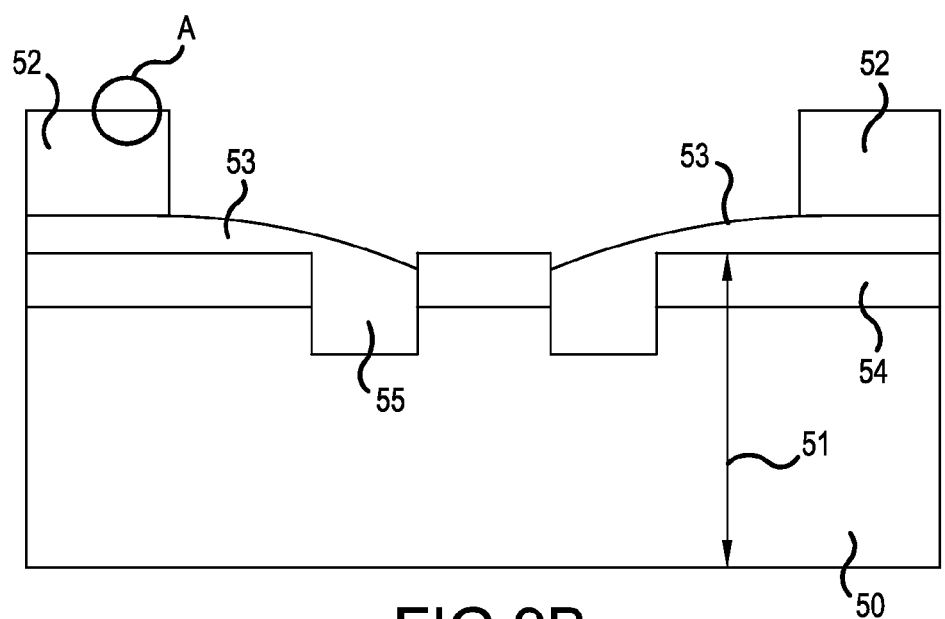

FIG. 8 is a sectional view of the essential part of a semiconductor device 200 according to the second embodiment of the present invention. The sectional view corresponds to FIG. 6A. The semiconductor device 200 is different from the semiconductor device 100 in that a dielectric film 1b, as shown in solid line, coats the exposed copper surfaces of the bottom faces 3a and 4a, which belong to the first groove 3 and the second groove 4, respectively. Coating the surfaces with the dielectric film 1b allows the effect to increase for preventing molten solder from spreading. Especially, when the first metal 7 is composed of copper, the present embodiment is preferable because copper has higher wettability to solder than aluminum. Besides, coating also side wall faces of the first groove 3 and the second groove 4 with the dielectric film 1b allows the effect to increase for preventing solder from spreading even more.

What is claimed is:
1. A semiconductor device, comprising:
a plurality of semiconductor chips;
a plurality of insulating substrates on each of which the respective semiconductor chip is fixed;
a heat sink having a plurality of first grooves entirely surrounding each one of more than one predetermined arrangement area, wherein each of the plurality of insulating substrates is arranged at each of the predetermined arrangement areas respectively, and a plurality of second grooves entirely surrounding the first grooves, wherein each of the second grooves are shallower in depth than each of the first grooves; and solder filled between the respective insulating substrate and the respective predetermined arrangement area on the heat sink and at least partially into the grooves to prevent further outflow and spreading beyond the second grooves.

2. The semiconductor device according to claim 1, wherein the depth of at least one of the first grooves is equal to or less than 50 μm, and an interval between the at least one first groove and at least one of the second grooves, is equal to or less than 40 μm, and wherein a sectional-area of the at least one first groove, determined as the product of the depth and the width of the at least one first groove is equal to or more than 7200 μm$^2$ and equal to or less than 20000 μm$^2$.

3. The semiconductor device according to claim 2, wherein the plurality of first grooves are laid out in a stripe pattern, and the sum of sectional-areas of the plurality of first grooves is equal to or more than 7200 μm$^2$ and equal to or less than 20000 μm$^2$.

4. The semiconductor device according to claim 2, wherein the plurality of first grooves are laid out in a stripe pattern, and an interval between the first grooves neighboring is equal to or more than 5 μm and equal to or less than 20 μm.

5. The semiconductor device according to claim 1, wherein the heat sink comprises a first metal, a surface of which is coated with a second metal layer.

6. The semiconductor device according to claim 5, wherein a depth of at least one of the second grooves is equal to or more than a thickness of the second metal layer, and equal to or less than three-quarters of the depth of the first groove.

7. The semiconductor device according to claim 5, wherein the first metal is aluminum or copper, and the second metal layer a nickel layer or a titanium layer.

8. The semiconductor device according to claim 5, wherein the first metal is copper, and a dielectric film is disposed on a bottom face of the first groove.

* * * * *